US007002218B2

(12) United States Patent
Yach

(10) Patent No.: US 7,002,218 B2
(45) Date of Patent: Feb. 21, 2006

(54) LOW CAPACITANCE ESD-PROTECTION STRUCTURE UNDER A BOND PAD

(75) Inventor: Randy L. Yach, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 92 days.

(21) Appl. No.: 10/787,387

(22) Filed: Feb. 26, 2004

(65) Prior Publication Data

US 2005/0189593 A1 Sep. 1, 2005

(51) Int. Cl.
*H01L 23/62* (2006.01)

(52) U.S. Cl. ...................... 257/356; 257/110; 257/120; 257/128; 257/173; 257/174; 257/355; 257/360; 257/362; 257/363; 257/546; 257/548; 257/550; 257/917

(58) Field of Classification Search ................ 257/110, 257/120, 128, 173–174, 355, 360–363, 546, 257/548, 550, 917, 356
See application file for complete search history.

(56) References Cited

U.S. PATENT DOCUMENTS

| | | | | |
|---|---|---|---|---|
| 4,642,667 | A * | 2/1987 | Magee ........................ | 257/370 |
| 5,166,089 | A * | 11/1992 | Chen et al. .................. | 438/328 |
| 5,181,091 | A * | 1/1993 | Harrington et al. ......... | 257/355 |
| 5,684,322 | A * | 11/1997 | Bernier ........................ | 257/355 |
| 5,719,733 | A * | 2/1998 | Wei et al. ...................... | 361/56 |
| 5,932,914 | A * | 8/1999 | Horiguchi .................... | 257/355 |
| 6,060,752 | A * | 5/2000 | Williams ..................... | 257/355 |
| 6,215,157 | B1 * | 4/2001 | Fukuda ........................ | 257/362 |
| 6,271,999 | B1 * | 8/2001 | Lee et al. ...................... | 361/56 |
| 6,281,428 | B1 * | 8/2001 | Chiu et al. ................... | 136/255 |
| 6,441,439 | B1 * | 8/2002 | Huang et al. ................ | 257/355 |
| 6,576,934 | B1 * | 6/2003 | Cheng et al. ................ | 257/107 |
| 6,833,592 | B1 * | 12/2004 | Lee ............................. | 257/372 |
| 2004/0075144 | A1 * | 4/2004 | Zitouni et al. .............. | 257/355 |
| 2004/0217425 | A1 * | 11/2004 | Brodsky et al. ............. | 257/360 |
| 2004/0251502 | A1 * | 12/2004 | Reddy et al. ................ | 257/356 |
| 2005/0045909 | A1 * | 3/2005 | Zhang ........................ | 257/173 |

* cited by examiner

*Primary Examiner*—Amir Zarabian
*Assistant Examiner*—Ida M. Soward
(74) *Attorney, Agent, or Firm*—Baker Botts L.L.P.

(57) ABSTRACT

An ESD-protection structure is located substantially under an integrated circuit bond pad. This ESD-protection structure is formed as a low capacitance structure by inserting a forward diode between the bond pad and the ESD clamp circuit. Placing the ESD-protection structure under the bond pad eliminates parasitic substrate capacitance and utilizes a parasitic PNP transistor formed from the inserted forward biased diode. The ESD-protection structure includes adjacent alternating P+ and N+ diffusions located substantially under a bond pad to be ESD protected. The P+ diffusions are connected to the bond pad metal with metal vias through an insulating layer. The N+ diffusions are adjacent to the P+ diffusions. An N+ diffusion surrounds the N+ and P+ diffusions, and ties together the N+ diffusions so as to form a continuous N+ diffusion completely around each of the P+ diffusions. An N– well is located substantially under the N+ and P+ diffusions. The surrounding N+ diffusion partially overlaps the edge of the N– well below it. An outer portion of the N+ diffusion, the portion overlapping the N– well, is within a P– well. Another N+ diffusion encircles the N+ diffusion surrounding the P+ diffusions. The another N+ diffusion is in the P– well and a field oxide may be located between the N+ diffusion and the another N+ diffusion. An NPN field transistor is formed with the N+ diffusion being the transistor collector, the P– well being the transistor base and the another N+ diffusion being the emitter.

25 Claims, 3 Drawing Sheets

LOW CAPACITANCE ESD-PROTECTION STRUCTURE UNDER A BOND PAD

FIELD OF THE INVENTION

The present invention relates generally to semiconductor integrated circuits, and more particularly to protection of the semiconductor integrated circuits from electrostatic discharge (ESD).

BACKGROUND OF THE INVENTION TECHNOLOGY

Modern electronic equipment uses digital semiconductor integrated circuits for operation thereof. The digital semiconductor integrated circuits receive inputs from various sources, e.g., pushbuttons, sensors, etc., and have outputs that control operation of the equipment based upon the various inputs thereto. The inputs and outputs of the semiconductor integrated circuits may be subject to undesirable high voltage electrostatic discharge (ESD) in addition to the desired input or output signal level. The ESD, characterized by fast transient high voltage discharges, may be from static electricity generated by a user of the equipment, equipment handling, power supply voltage transients and the like.

Semiconductor integrated circuits are becoming functionally more capable and are operating at faster speeds. The increased functional capability is the result of higher transistor count in each integrated circuit, thereby allowing the operation of more sophisticated software and/or firmware to produce the many features available in the equipment. The faster operating speeds further enhance the operation of the equipment. In order to keep integrated circuit die size within a reason cost, the electronic circuits therein must be more densely concentrated in as small an area as possible, thus the many transistors making up the electronic circuits within the integrated circuit must be made as small as possible. As these transistors become smaller and smaller, the spacing of the parts of each transistor, e.g., source, gate, drain, becomes smaller, as does the dielectric thickness of the insulation between these parts. The extremely thin dielectric is very susceptible to damage by excessive voltages present in an ESD event. Also, as operational speeds increase, the need for low capacitance structures becomes more important.

Various voltage protection circuits have been used to limit the peak voltage at an input and/or output of an integrated circuit. Attempts have been made to incorporate ESD protection within the integrated circuit, but are not very effective and/or require a significant amount of area within the integrated circuit die, and may add unacceptable additional capacitance to the circuit node being protected.

Therefore, what is needed is an ESD protection circuit integral within the integrated circuit die that is effective is protecting sensitive input and/or output circuits and has low capacitance.

SUMMARY OF THE INVENTION

The invention overcomes the above-identified problems as well as other shortcomings and deficiencies of existing technologies by providing an ESD-protection structure located substantially under an integrated circuit bond pad, having low capacitance and able to absorb high current ESD events. An ESD-protection structure is located substantially under an integrated circuit bond pad in which is formed a low capacitance structure by inserting a forward diode between the bond pad and the ESD clamp circuit. Placing the ESD-protection structure under the bond pad eliminates parasitic substrate capacitance and a parasitic PNP transistor is formed from the inserted forward biased diode.

The invention comprises a semiconductor structure of adjacent alternating P+ and N+ diffusions located substantially under the bond pad to be ESD protected. The P+ diffusions may be shaped in squares, rectangles, stripes and the like (other shapes and are also contemplated herein), and may be connected to the bond pad with conductive vias through an insulating layer located between the bond pad and the P+ and N+ diffusions. The N+ diffusions are arranged adjacent to and surround the P+ diffusions. The N+ diffusions are insulated from the bond pad by the insulating layer. An N– well is located in a P– well of the integrated circuit and substantially under the N+ and P+ diffusions. The N+ diffusion partially overlaps the edge of the N– well into the P– well. An outer portion of the N+ diffusion, the portion overlapping the N– well, is within the P– well.

Another N+ diffusion encircles the N+ diffusion surrounding the P+ diffusions. The another N+ diffusion is in the P– well and a field oxide is located between the N+ diffusion and the another N+ diffusion. A field transistor (NPN) is thereby formed with the N+ diffusion being the transistor collector, the P– well being the transistor base and the another N+ diffusion being the emitter. The another N+ diffusion (emitter) may be connected to ground by a conductive connection, e.g., metal or low resistance semiconductor material. The P– well may be a P– substrate of an integrated circuit, or the P– well may be a P– well in an N– substrate of an integrated circuit.

Capacitance of the above described ESD-protection structure is minimal because the only capacitance seen by the bond pad is the P+ diffusions to N– well and the N+ and P+ diffusions/N+ diode junction capacitance. The bond pad metal to the P– well capacitance is substantially reduced by the ESD-protection structure being mostly under the bond pad.

The invention ESD-protection structure clamps a voltage transient through the NPN field transistor in combination with the parasitic PNP transistor. The NPN and PNP transistors work together to increase the ESD-protection response through the multiplication of the gains of both transistors. The bond pad voltage to ground increases until the N+ diffusion to P– well diode breaks down (conducts). The bond pad voltage will therefore be a diode drop above this breakdown voltage. Then the NPN field transistor snaps back. The ESD-protection clamping operation is further enhanced by the vertical PNP parasitic structure formed from the P+ diffusions, the N– well and the P– well. As the transient current flows through the NPN field transistor, a portion of the current flows directly to the P– well due to the presence of the aforementioned vertical PNP parasitic structure.

A technical advantage of the invention is very little additional capacitance to the bond pad. Yet another technical advantage is high current clamping of ESD transients. Another technical advantage is enhanced ESD clamping by the vertical PNP parasitic structure. Another technical advantage is reduce size for an ESD structure. Yet another technical advantage is isolating the bond pad from the substrate capacitance.

Features and advantages of the invention will be apparent from the following description of the embodiments, given for the purpose of disclosure and taken in conjunction with the accompanying drawing.

BRIEF DESCRIPTION OF THE DRAWING

A more complete understanding of the present disclosure and advantages thereof may be acquired by referring to the following description taken in conjunction with the accompanying drawing, wherein:

FIG. 1a illustrates a schematic diagram of a sectional elevational view of an ESD-protection structure, according to an exemplary embodiment of the invention;

FIG. 1b illustrates a schematic diagram of a plan view of the ESD-protection structure shown in FIG. 1a;

Figure 1:
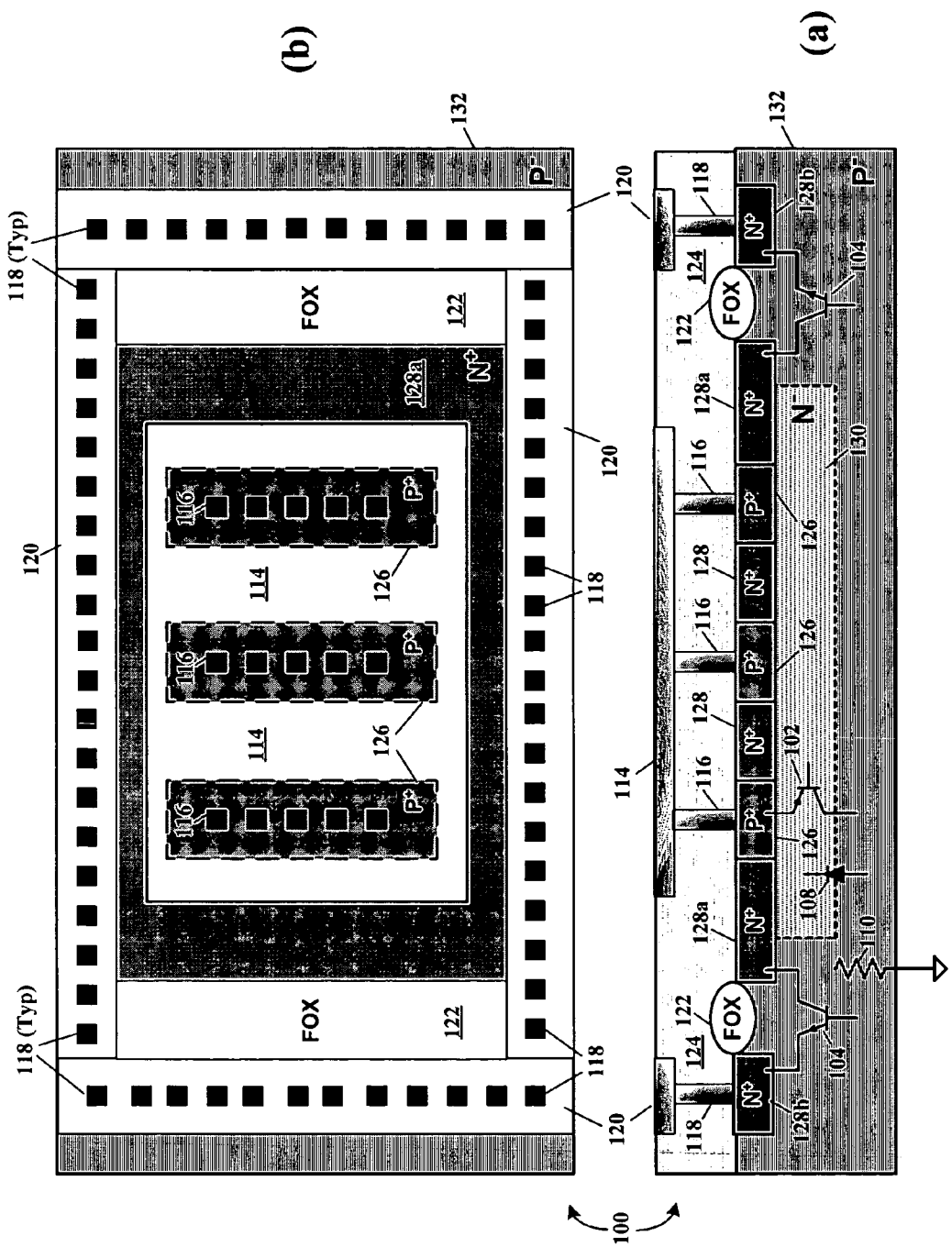

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Referring now to the drawings, the details of exemplary embodiments of the present invention are schematically illustrated. Like elements in the drawing will be represented by like numbers, and similar elements will be represented by like numbers with a different lower case letter suffix. P− refers to lighter doped p-silicon, P+ refers to heavier doped p-silicon, N− refers to lighter doped n-silicon, and N+ refers to heavier doped n-silicon, wherein p-silicon has a plurality of positive immobile silicon ions, and n-silicon has a plurality of negative immobile silicon ions.

Figure 1C:
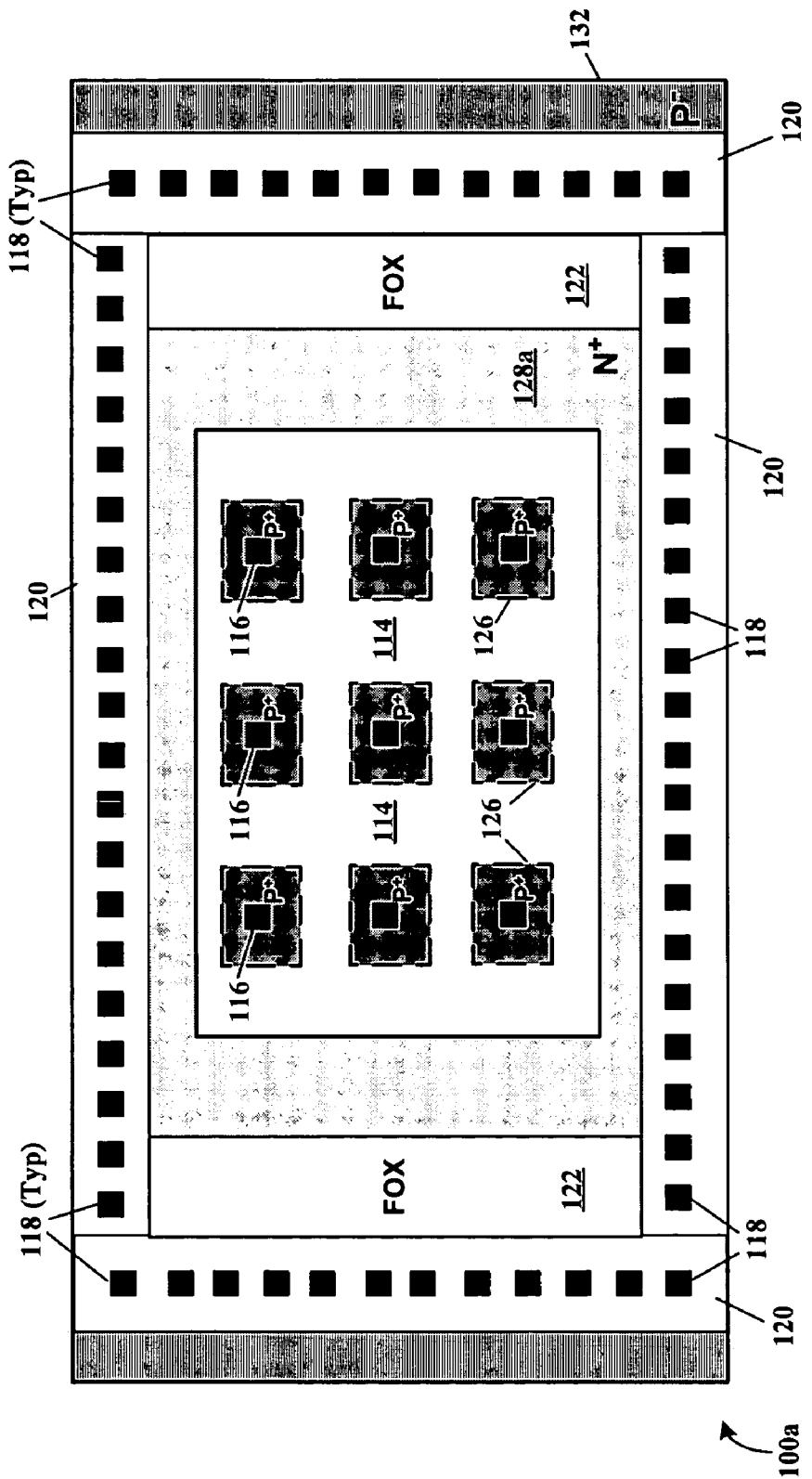
FIG. 1c illustrates a schematic diagram of a plan view of another ESD-protection structure.

Referring to FIG. 1, depicted is a schematic diagram of an ESD-protection structure, according to an exemplary embodiment of the invention. FIG. 1a illustrates a sectional elevational view, FIG. 1b illustrates a plan view of the ESD-protection structure and FIG. 1c illustrates a plan view of another ESD-protection structure. A semiconductor integrated circuit comprises many transistors, inputs and output. The ESD-protection structure shown in FIG. 1 may be advantageously used for both inputs and outputs of the integrated circuit to protect the delicate transistors connected thereto.

The ESD-protection structure of FIG. 1, generally represented by the numeral 100, is located substantially under an integrated circuit bond pad 114. The ESD-protection structure 100 comprises alternating P+ diffusions 126 and N+ diffusions 128, located substantially under the integrated circuit bond pad 114. The P+ diffusions 126, may be arranged in stripes (see FIG. 1b) or in alternating squares (see FIG. 1c), and are connected to the bond pad 114 with conductive vias 116 through an insulating layer 124 located between the bond pad 114 and the P+ diffusions 126 and the N+ diffusions 128. The N+ diffusions 128 are adjacent to and surround the P+ diffusions 126. Other shapes for the P+ diffusions 126 may be used and are contemplated herein. An N+ diffusion 128a surrounds the N+ diffusions 128 and P+ diffusions 126, and ties together the N+ diffusions 128 so as to form a continuous N+ diffusion 128 completely around each of the P+ diffusions 126. The N+ diffusions 128 may be formed as one N+ diffusion 128 during fabrication of the integrated circuit. The N+ diffusions 128 are insulated from the bond pad metal by the insulating layer 124. The P+ diffusions 126 are connected to the bond pad 114 by conductive vias 116. An N− well 130 is located substantially under the N+ diffusions 128 and the P+ diffusions 126. The surrounding N+ diffusion 128a partially overlaps the edge of the N− well 130 below. A P− well 132 may comprise P− semiconductor material of an integrated circuit substrate (not shown). The ESD structure may also be formed within a P− well located in an N− semiconductor material of an integrated circuit substrate (not shown). An outer portion of the N+ diffusion 128a, the portion overlapping the N− well 130, is within the P− well 132. Another N+ diffusion 128b encircles the N+ diffusion 128a that ties together the N+ diffusions 128. The another N+ diffusion 128b is in the P− well 132 and a field oxide 122 may be located between the N+ diffusion 128a and the another N+ diffusion 128b. In addition, the N+ diffusions 128 may be connected together by conductive vias connected together by conductive paths (not shown).

An NPN field transistor 104 is formed with the N+ diffusion 128a being the transistor collector, the P− well 132 being the transistor base and the another N+ diffusion 128b being the transistor emitter. The another N+ diffusion 128b (emitter) may be connected to ground by a conductive connection, e.g., metal or low resistance semiconductor material (e.g., vias 118 and conductors 120, one or more of each). A PNP transistor 102 is formed with the P+ diffusions 126 being the transistor emitter, the N− well 130 being the transistor base and the P− well 132 being the transistor collector. A diode 108 is formed between the N− well 130 and the P− well 132. Generally, the P− well 132 is coupled to ground (and/or a negative rail of a power source) and functions like a resistance to ground, generally represented by resistor 110.

Capacitance of the above described ESD-protection structure 100 is minimal because the only capacitance seen by the bond pad 114 is the P+ diffusions 126 to N− well 130 which forms a diode junction capacitance. The bond pad 114 to the P− well 132 capacitance is substantially reduced because the ESD-protection structure 100 being mostly under the bond pad 114.

Figure 2:
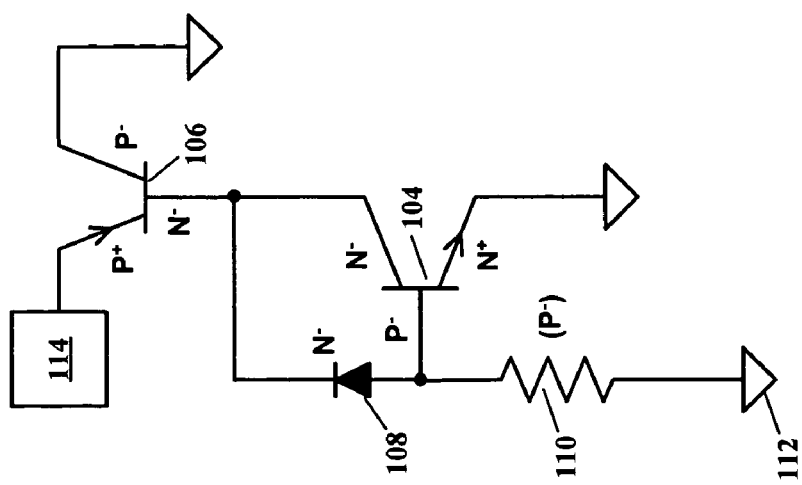
FIG. 2 illustrates a schematic circuit diagram of the ESD-protection structure of FIG. 1.

Referring to FIG. 2, depicted is a schematic circuit diagram of the ESD-protection structure of FIG. 1. The invention ESD-protection structure 100 clamps a voltage transient on the bond pad 114 substantially the same as would be typical of a NPN field transistor or other semiconductor structures. The bond pad voltage to ground increases until the N+ diffusion to P− well diode 108 breaks down (conducts). The bond pad voltage will therefore be a diode drop above this breakdown voltage. Then the NPN field transistor 104 snaps back. The ESD clamping operation is enhanced by the vertical PNP parasitic structure (transistor 102) formed from the P+ diffusions, the N− well and the P− well. As the transient current flows through the NPN field transistor 104, a portion of the current flows directly to the P− well due to the presence of the aforementioned vertical PNP parasitic structure (transistor 102).

The invention, therefore, is well adapted to carry out the objects and attain the ends and advantages mentioned, as well as others inherent therein. While the invention has been depicted, described, and is defined by reference to exemplary embodiments of the invention, such a reference does not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An ESD-protection structure, comprising:
   an integrated circuit having a lighter doped p-silicon well (P– well), wherein the P– well is coupled to a common power supply rail;
   a lighter doped n-silicon well (N– well) in the P– well;
   a plurality of heavier doped p-silicon diffusions (P+ diffusions) in the N– well;
   a first heavier doped n-silicon diffusion (N+ diffusion) in the N– well, wherein the first N+ diffusion surrounds the plurality of P+ diffusions and overlaps the N– well into the P– well;
   a second heavier doped n-silicon diffusion (N+ diffusion) in the P– well, wherein the second N+ diffusion surrounds the first N+ diffusion;
   a bond pad connected to the plurality of P+ diffusions; and
   a connection to the second N+ diffusion.

2. The ESD-protection structure of claim 1, wherein the P– well is the integrated circuit substrate.

3. The ESD-protection structure of claim 1, further comprising a field oxide located between the first and second N+ diffusions.

4. The ESD-protection structure of claim 1, further comprising a lighter doped n-silicon substrate (N– substrate) of the integrated circuit, wherein the P– well is in the N– substrate.

5. The ESD-protection structure of claim 1, wherein the plurality of P+ diffusions are stripe shaped.

6. The ESD-protection structure of claim 1, wherein the plurality of P+ diffusions are rectangular shaped.

7. The ESD-protection structure of claim 1, wherein the plurality of P+ diffusions are square shaped.

8. The ESD-protection structure of claim 1, wherein the bond pad is connected to the plurality of P+ diffusions with a first plurality of conductive vias.

9. The ESD-protection structure of claim 1, wherein the connection to the second N+ diffusion is with a second plurality of conductive vias.

10. The ESD-protection structure of claim 8, wherein the first plurality of conductive vias are metal.

11. The ESD-protection structure of claim 8, wherein the first plurality of conductive vias comprise conductive semiconductor silicon.

12. The ESD-protection structure of claim 9, wherein the second plurality of conductive vias are metal.

13. The ESD-protection structure of claim 9, wherein the second plurality of conductive vias comprise conductive silicon.

14. The ESD-protection structure of claim 1, further comprising a second connection to the first N+ diffusion with a third plurality of conductive vias.

15. The ESD-protection structure of claim 1, wherein the common power supply rail is coupled to ground.

16. The ESD-protection structure of claim 1, wherein the plurality of P+ diffusions, the first N+ diffusion and the N– well are located substantially under the bond pad.

17. An ESD-protection structure, comprising:
   an integrated circuit having a lighter doped p-silicon well (P– substrate), wherein the P– well is coupled to a common supply rail;
   a lighter doped n-silicon well (N– well) in the P– substrate;
   a plurality of heavier doped p-silicon diffusions (P+ diffusions) in the N– well, wherein the plurality of P+ diffusions are rectangular shaped;
   a first heavier doped n-silicon diffusion (N+ diffusion) in the N– well, wherein the first N+ diffusion surrounds the plurality of P+ diffusions and overlaps the N– well into the P– well;
   a second heavier doped n-silicon diffusion (N+ diffusion) in the P– substrate, wherein the second N+ diffusion surrounds the first N+ diffusion;
   a field oxide located between the first and second N+ diffusions;
   a bond pad connected to the plurality of P+ diffusions; and
   a connection to the second N+ diffusion.

18. The ESD-protection structure of claim 17, wherein the bond pad is connected to the plurality of P+ diffusions with a first plurality of conductive vias.

19. The ESD-protection structure of claim 17, wherein the connection to the second N+ diffusion is with a second plurality of conductive vias.

20. The ESD-protection structure of claim 18, wherein the first plurality of conductive vias are metal.

21. The ESD-protection structure of claim 18, wherein the first plurality of conductive vias comprise conductive semiconductor silicon.

22. The ESD-protection structure of claim 19, wherein the second plurality of conductive vias are metal.

23. The ESD-protection structure of claim 19, wherein the second plurality of conductive vias comprise conductive semiconductor silicon.

24. The ESD-protection structure of claim 17, wherein the common power supply rail is coupled to ground.

25. The ESD-protection structure of claim 17, wherein the plurality of P+ diffusions, the first N+ diffusion and the N– well are located substantially under the bond pad.

* * * * *